United States Patent [19]

Nam

[11] Patent Number: 5,696,507
[45] Date of Patent: Dec. 9, 1997

[54] METHOD AND APPARATUS FOR DECODING VARIABLE LENGTH CODE

[75] Inventor: Seung-Hyun Nam, Kyeonggi-Do, Rep. of Korea

[73] Assignee: Daewoo Electronics Co., Inc., Seoul, Rep. of Korea

[21] Appl. No.: 655,838

[22] Filed: May 31, 1996

[51] Int. Cl.$^6$ ................................................ H03M 7/40
[52] U.S. Cl. .................................... 341/67; 341/65
[58] Field of Search ........................ 341/65, 67, 79, 341/51

[56] References Cited

U.S. PATENT DOCUMENTS

| | | | |
|---|---|---|---|
| 3,918,047 | 11/1975 | Denes | 340/347 DD |
| 5,173,695 | 12/1992 | Sun | 341/67 |
| 5,245,338 | 9/1993 | Sun | 341/67 |
| 5,394,144 | 2/1995 | Kim | 341/67 |
| 5,428,356 | 6/1995 | Ozaki | 341/67 |
| 5,432,512 | 7/1995 | Park | 341/67 |
| 5,561,690 | 10/1996 | Park | 375/340 |

*Primary Examiner*—Jeffrey A. Gaffin
*Assistant Examiner*—Peguy JeanPierre
*Attorney, Agent, or Firm*—Foley & Lardner

[57] ABSTRACT

Disclosed are method and apparatus for decoding variable length codewords such as a digital image signal at a high speed using a Huffman code tree, in accordance with the present invention, since a variable length coded codeword is stored in a look-up memory in a node order according to levels of a canonical Huffman code tree structure, and the node order of the coded codewords is detected by a predetermined calculating operation so that the node order is used as an address of the decoding codeword when decoding the variable length coded codeword. Therefore, the variable length code decoding is achieved in a manner which simply stores variables in a memory and a latch without changing a hardware when a Huffman code tree is changed by an operation of a central system. Also, since the present invention may by processing a coded codeword with a clock using a parallel calculation regardless of a decoded codeword length, it can decode a coded codeword at higher speed than a conventional variable length decoding apparatus and method thereof which perform to decode in the unit of bit.

11 Claims, 6 Drawing Sheets

| CLK | LATCH 110 | LATCH 111 | LATCH 125 | LATCH 126 | LEAD 105 | READ | BS109 SHIFT | BS127 SHIFT | CARRY | BARREL SHIFTER 109 OUTPUT | BARREL SHIFTER 127 OUTPUT | DE-CODED WORD | LENGTH |
|---|---|---|---|---|---|---|---|---|---|---|---|---|---|
| 1 | x | x | x | x | $a_1$-$a_8b_1$-$b_6c_1c_2$ | 1 | 16 | 16 | 1 | x | x | | |
| 2 | x | x | x | $a_1$-$a_8b_1$-$b_6c_1c_2$ | $c_3$-$c_5d_1$-$d_{13}$ | 1 | 16 | 16 | 1 | x | $a_1$-$a_8b_1$-$b_6c_1c_2$ | | |
| 3 | $a_1$-$a_8b_1$-$b_6c_1c_2$ | $a_1$-$a_8b_1$-$b_6c_1c_2$ | $c_3$-$c_5d_1$-$d_{13}$ | $c_3$-$c_5d_1$-$d_{13}$ | $d_{14}d_{15}e_1$-$e_{12}f_1f_2$ | 1 | 16 | 16 | 1 | $a_1$-$a_8b_1$-$b_6c_1c_2$ | $c_3$-$c_5d_1$-$d_{13}$ | | |
| 4 | $b_1$-$b_6c_1$-$c_5d_1$-$d_5$ | $c_3$-$c_5d_1$-$d_{13}$ | $c_3$-$c_5d_1$-$d_{13}$ | $d_{14}d_{15}e_1$-$e_{12}f_1f_2$ | $f_3$-$f_{10}g_1$-$g_8$ | 1 | 8 | 8 | 0 | $b_1$-$b_6c_1$-$c_5d_1$-$d_5$ | $d_6$-$d_{15}e_1$-$e_6$ | | |
| 5 | $c_1$-$c_5d_1$-$d_{11}$ | $d_6$-$d_{15}e_1$-$e_6$ | $d_{14}d_{15}e_1$-$e_{12}f_1f_2$ | $f_3$-$f_{10}g_1$-$g_8$ | $f_3$-$f_{10}g_1$-$g_8$ | 0 | 6 | 14 | 0 | $c_1$-$c_5d_1$-$d_{11}$ | $d_{12}$-$d_{15}e_1$-$e_{12}$ | | |
| 6 | $d_1$-$d_{15}e_1$ | $e_2$-$e_{12}f_1$-$f_5$ | $f_3$-$f_{10}g_1$-$g_8$ | $f_3$-$f_{10}g_1$-$g_8$ | $g_9h_1$-$h_{15}$ | 1 | 5 | 19 | 1 | $d_1$-$d_{15}e_1$ | $e_2$-$e_{12}f_1$-$f_5$ | | |
| 7 | $e_1$-$e_{12}f_1f_4$ | $f_5$-$f_{10}g_1$-$g_8$ | $f_3$-$f_{10}g_1$-$g_8$ | $g_9h_1$-$h_{15}$ | $h_{16}\cdots$ | 1 | 15 | 18 | 1 | $e_1$-$e_{12}f_1f_4$ | $f_5$-$f_{10}g_1$-$g_8$ | | |
| 8 | $f_1$-$f_{10}g_1$-$g_6$ | $g_7$-$g_9h_1$-$h_{13}$ | $g_9h_1$-$h_{15}$ | $g_9h_1$-$h_{15}$ | $h_{16}\cdots$ | 1 | 12 | 14 | 0 | $f_1$-$f_{10}g_1$-$g_6$ | $g_7$-$g_9h_1$-$h_{13}$ | | |
| 9 | $g_1$-$g_9h_1$-$h_7$ | $h_8$-$h_{16}\cdots$ | $f_3$-$f_{10}g_1$-$g_8$ | $\cdots$ | $\cdots$ | 0 | 10 | 24 | 1 | $g_1$-$g_9h_1$-$h_7$ | $h_8$-$h_{16}\cdots$ | | |
| | | | | | | | | | | $h_1$-$h_{16}$ | $\cdots$ | | |

FIG. 3

| $a_1 \cdots a_8$ | $b_1 \cdots b_6$ | $c_1 \cdots c_5$ | $d_1 \cdots d_{15}$ | $e_1 \cdots e_{12}$ | $f_1 \cdots f_{10}$ | $g_1 \cdots g_9$ | $h_1 \cdots h_{16}$ |
|---|---|---|---|---|---|---|---|

INPUT BIT STREAM

METHOD AND APPARATUS FOR DECODING VARIABLE LENGTH CODE

BACKGROUND OF THE INVENTION

1. Field of the Invention

The present invention relates to a method and apparatus for decoding variable length code, and more particularly to a method and apparatus for decoding variable length codewords such as a digital image signal at a high speed using a Huffman code tree.

2. Description of the Prior Art

Generally, a digital image signal has many advantages. For example, the digital image signal is superior to an analog image signal in image quality. Therefore the digital image signal is gradually being used more often, which is a recent trend. On the other hand, digitalizing image information, because it has massive information contents, must be compressed and reduced in order to efficiently transfer the image information. Therefore, the efficient image compressing method using image characteristics can be regarded as a main field of image communication. In methods for compressing image data, hybrid coding methods are known as the most efficient manner wherein probabalistic coding, space and time compressions are combined. Most of the hybrid coding methods make use of a differential pulse code modulation (DPCM), a discrete cosine transform (DCT), a quantization of a DCT coefficient, and a variable length coding (VLC).

Variable-length coding is a coding technique often used for lossless data compression. In accordance with this technique, fixed-length data are converted into variable-length codewords according to the statistics of the data. In general, the lengths of the codewords are chosen so that shorter codewords are used to represent the more frequently occurring data and longer codewords are chosen to represent the less frequently occurring data. By properly assigning the variable-length codewords to the library of all possible source codewords, the average word length of the variable-length code is shorter than that of the original data and, therefore, data compression is achieved. The Huffman code design is a procedure commonly used to construct a minimum redundant variable-length code for a known data statistic. In general, the encoding process can be implemented by a table look-up process using the input data to address the table. The codewords and word-lengths are stored as table contents and outputted sequentially, through a buffer, at a constant data rate onto the data channel. At the receiving end, however, the decoding process is more complicated. Due to the variable-length nature, each codeword has to be segmented from the received bit string before it can be decoded into a source symbol. Therefore, the design of a variable-length decoder is always more difficult than the design of a variable-length encoder.

There are several methods to decode a stream of variable-length codewords. The one most often used is called the tree-searching algorithm. A variable-length code can always be represented by a tree with codewords as leaves (also called terminal nodes). The decoding starts from the root of the code tree and is guided by the received bit string to follow one of two branches at each node. When a terminal node is reached, the end of a codeword is detected and it is segmented from the remaining string. The type of decoder includes a logic circuitry corresponding to the tree and a control circuitry to traverse the code tree. This approach may be slow, especially for long codewords, since a bit-by-bit search through the code tree is required for each decoded symbol. In typical applications, an input symbol is represented by several bits. The speed of shifting received bits into a decoder is several times as high as the averaged speed of decoded data. Therefore, the tree-searching based decoder has to be operated at the speed of several times of the output data rate.

Such high-speed requirements are particularly critical for the digital transmission of high definition television (HDTV) signals. In such an HDTV system the total sample rate (combining luminance and chrominance signals) is likely to be 100 MHz. If variable-length coding is used, the maximum length code word could typically be 16 bits. A bit-by-bit decoder would thus need to shift at 16 times the sample rate, or at 1.6 Gbits/sec, to detect codewords at the sample rate. Such high speeds are very difficult to implement using current IC technology.

Also, there has been proposed various kinds of devices to decode a stream of variable-length codewords. The variable-length decoding device is divided into a sequential decoding and a parallel decoding. At first, the sequential decoding is a method which begins to decode a bit string in order from the front thereof, and divided into a normal speed input structure, a normal speed output structure and a variable input/output structure. The design of the sequential decoding is easy but the sequential decoding has the problem of slow speed, because it has a normal speed input structure that processes the inputted bit string one bit of a time. A variable length decoding device of a normal speed output structure to which M. T. Sun of Bell Core has proposed is a device which after packing the inputted bit string as much as the longest codeword length, inputs it into a read only memory/programmable logic array (ROM/PLA) table, the variable length decoding device searches the codewords stored in the table to shift the searched codeword lengths to a barrel shifter, and searches the next codeword, during decoding of the codewords (U.S. Pat. Nos. 5,173,695 and 5,245,338 issued to Bell Core). That is, the variable length decoding device of a normal speed output structure is an apparatus which has faster than that of the normal speed input structure in decoding speed, since it decodes a codeword during a cycle.

Figure 1:
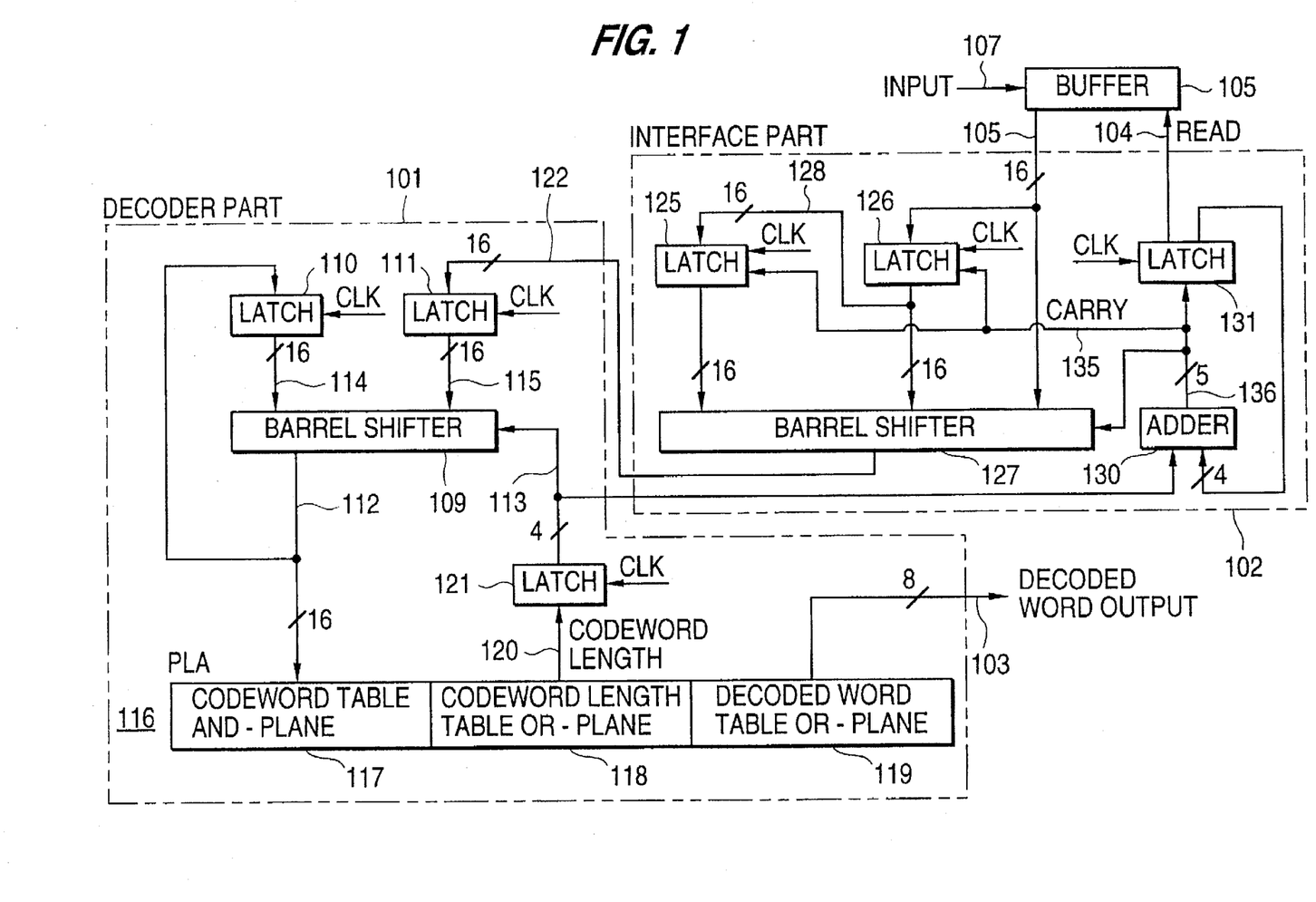
FIG. 1 is a block diagram of a conventional variable-length decoder.
Figure 3:
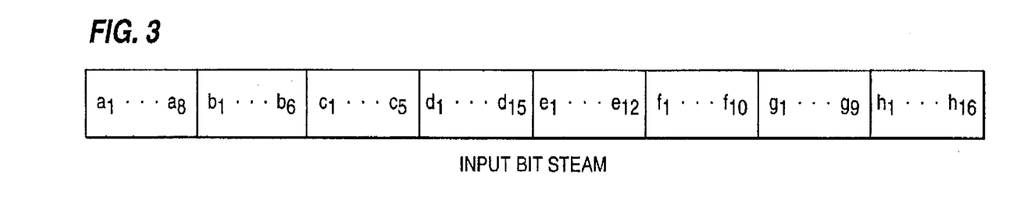
FIG. 3 is a view for showing the input bit stream used for the example of FIG. 2.

Hereinafter, the operation of the conventional decoder is more readily understood. It is assumed that the data stream input from data channel 107 to buffer 106 consists of the bit stream $a_1-a_8b_1-b_6c_1-c_{15}d_1-d_{15}e_1-e_{12}f_1-f_{10}g_1-g_9h_1-h_{16} \ldots$ , as shown in FIG. 3, where $a_1-a_8$ represents the eight bits in the first variable-length word, $b_1-b_6$ represents the six bits in the second variable-length word, etc.

Prior to the first clock tick, latch 131 is initialized so that Read output is "1". Latch 121 is also initialized so that first barrel shifter 109 has an initial shift of "16". With "16" input to adder 130 from latch 121 and 16 modulo-16 (equal to "0") also input to adder 130 from latch 131, the output of adder 130, and thus the shift of second barrel shifter 127 is "16", with Carry being "1". With Read being "1", the first data segment, consisting of the 16-bits $a_1-a_8b_1-b_6c_1c_2$, is input on leads 105 to the interface part 102. At this time all the latches, the outputs of barrel shifters 109 and 127, and the outputs of PLA 116 are noise values, represented in FIG. 2 with "X".

Figure 2:
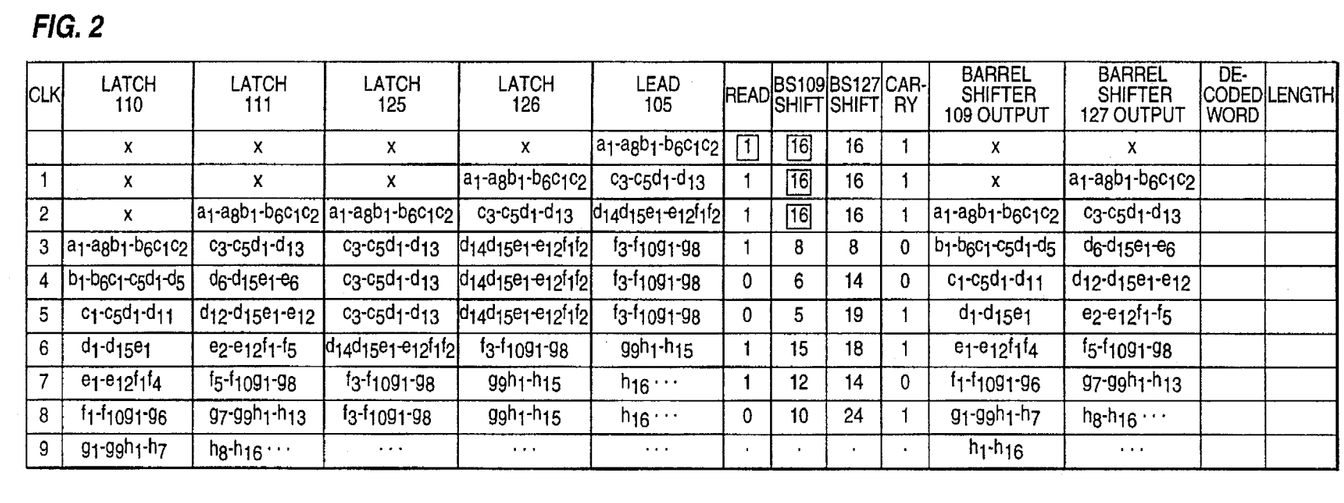
FIG. 2 is a view for illustrating an example of the operation of the decoder of FIG. 1 through several clock cycles.

At the first clock cycle tick, the previous Carry "1" becomes a Read "1", which retrieves the next data segment from buffer 106 onto leads 105. At this clock tick, however, the previous Carry "1" causes the previous output of buffer 106 to be read into latch 126. Latch 121 remains initialized at "16", so that the shift of first barrel shifter 109 remains "16" and adder 130 remains at "16", together with Read at "1" and Carry at "1". With the sift of second barrel shifter 127 being "16" and the 17th–32nd bits being $a_1$–$a_8b_1$–$b_6c_1c_2$ from latch 126, that sequence appears at the output of second barrel shifter 127. Latches 100, 111 and 125 contain noise, as does the output of first barrel shifter 109 and the decoded word and codeword length outputs of PLA 116.

At the second clock tick, the previous output of second barrel shifter 127 is latched into latch 111. Since Read is still "1" and the previous carry was "1", the next data segment (the third) is retrieved from buffer 106, the data segment (the first) in latch 126 is latched into latch 125, and the second data segment is latched into latch 126. Latch 121 is still initialized so that the shift of first barrel shifter 109 is "16". This maintains the output of adder 130 at "16" and Carry and Read at "1". Since the previous output of second barrel shifter 127 consisted of the first data segment, at the second clock tick that segment appears in latch 111 and in the 17th–32nd input positions of first barrel shifter 109. The "16" at the shift input to first barrel shifter 109 thereby transfers this first segment to the barrel shifter output on leads 112. The "16" at the shift input of second barrel shifter 127 transfers the second data segment, $c_3$–$c_5d_1$–$d_{13}$, in latch 126 to the output of second barrel shifter 127. The codeword table 117 in PLA 116 recognizes the first eight bits in the first segment as codeword "A". The decoded word table 119 outputs this fixed-length decoded word, A, on leads 103. Codeword length table 118 outputs the length, "8", of this word on leads 120.

On the third clock tick, this first data segment is latched into latch 110, and thus into the first 16-inputs of first barrel shifter 109. The previous decoded length, "8", is latched into latch 121, which is therefore the shift of first barrel shifter 109. The output of first barrel shifter 109 shifted to the 9th–24th input bits, or the sequence $b_1$–$b_6c_1$–$c_5d_1$–$d_5$. The Carry "1" from at the second clock tick becomes a Read "1" at this third tick, thereby retrieving the next data segment from buffer 106. This previous Carry "1", upon the occurrence of the third tick, transfers the previous segments from buffer 106 to latch 126, and from latch 126 to latch 125. The "8" at the output of latch 121 is added by adder 130 to the previous modulo-16 output of latch 131 (equal to "0") to form a new output equal to "8". The shift of second barrel shifter 127 now is "8", with Carry being "0". The output of second barrel shifter 127 now begins with its 9th input, which is $d_6$. This sequence is thus continuous with the sequence at the output of first barrel shifter 109, which sequences together will form the inputs to first barrel shifter 109 at the next clock tick. During this third clock cycle, codeword B is recognized in the first 6-bits input to codeword table 117, and the fixed-length decoded word B is output on leads 103 and the codeword length "6" is output by codeword length table 118.

Since the previous Carry was "0", at the fourth clock tick the next data segment is not retrieved from buffer 106 and the contents of latches 125 and 126 remain the same as in the previous clock cycle. The previous output of first barrel shifter 109 is transferred into latch 110 beginning with bit $b_1$, and the previous output of second barrel shifter 127 is shifted into latch 111, beginning with $d_6$. The "6" now at the output of latch 121 shifts the first barrel shifter 109 output to the 7th–22nd bits, beginning with bit $c_1$ and ending with bit $d_{11}$. This same "6" is added by adder 130 to the previous "8", to produce a shift of "14" to second barrel shifter 127. The output of second barrel shifter 127 thus begins with the 15th bit input, or $d_{12}$, which is next bit following the last bit in first barrel shifter 109. Since the accumulated codeword lengths is still less than "16", the Carry output is still "0". The codeword C is output by decoded word table 119 and its codeword length of "5" is output by codeword length table 118.

AT the fifth clock tick the previous output of barrel shifter 112 is latched into latch 110, beginning with bits $c_1$–$c_3$, and the previous output of second barrel shifter 127 is latched into latch 111. The output window of first barrel shifter 109 is shifted 5-bits in accordance with the previous codeword length thus beginning with bit $d_1$. the "5" in latch 121 is accumulated with the previous "14" in latch 131 to yield "19" at the output of adder 130, which shifts second barrel shifter 127 to the 20th–35th bits and produces a carry of "1". The codeword D is output by decoded word table 119 and its length of "15" is output by codeword length table 118.

At the sixth clock tick, Read is "1" since the previous Carry was "1" and the next data segment is retrieved from buffer 106 and input to second barrel shifter 127 as the previous segments are shifted into latch 126 and latch 125. In the same manner as previously described the output of first barrel shifter 109 is shifted to begin with the first bit of the next-to-be-decoded word, $e_1$. Codeword E is decoded and a Carry is generated when the modulo-16 previous accumulated codeword length, "15", to produce an accumulated codeword length of "18".

However, the conventional variable length decoding apparatuses as mentioned above must use a ROM/PLA table for searching codewords. Accordingly, when coded codewords are changed, the conventional variable length decoding apparatuses have a problem which may require a user to change ROM or the design of the PLA.

SUMMARY OF THE INVENTION

Therefore, a first object of the present invention is to provide a method for decoding a variable length code at a high speed using a Huffman code tree without changing the memory or the design thereof storing codewords based on a Huffman tree when decoded codewords are changed.

A second object of the present invention is to provide an apparatus for decoding a variable length code at a high speed using a Huffman code tree without changing the memory or the design thereof storing codewords based on a Huffman tree when decoded codewords are changed.

In order to achieve the above-mentioned first object of the present invention, there is provided a method for decoding a variable length code, the method comprising the steps of:

a) receiving a coding bit string for decoding having a plurality of variable length codewords based on a Huffman code tree structure, to pack the received coding bit string for decoding as many as a longest codeword length, and to output the packed coding bit string for decoding;

b) calculating node position values for the packed coding bit string for decoding of the longest codeword length outputted from the step a) in order to detect a boundary line of a codeword from the packed coding bit string for decoding as many as the longest codeword length;

c) detecting a code length of the variable codeword according to the calculated node position values from the step b);

d) calculating the total terminal node number from level "0" to a prior level to a level in which a node corresponding to a codeword according to the detected code length from the step c) is located;

e) adding a node position value corresponding to the detected code length from the the step c) in the calculated node position values from the step b) to the calculated total terminal node number from the step d), to output the added value;

f) reading out to-be decoded codewords having the added value from the step e) as an address from a memory which are sequentially storing the decoding codewords from a root of a canonical Huffman code tree according to a node position of decoded codeword; and g) judging whether or not a inputted to-be decoded bit string remains, and if no inputted to-be decoded bit string remains, to finish a routine, and if an inputted to-be decoded bit string remains, to return to the step a).

Preferably, the node position values are calculated by an expression $$PT_k = \sum_{i=1}^{k} 2^{k-i}\gamma_i - \sum_{i=0}^{k-1} 2^{k-i}L_i$$

at the step b), wherein the $PT_k$ denotes node positions in accordance with binary input bits $\gamma_1, \gamma_2, \gamma_3 \ldots \gamma_k$ from 1 to k in a k level of the Huffman tree, the $\gamma_i$ is bit value of each bit string $\gamma_1, \gamma_2, \gamma_3 \ldots$, and the $L_i$ is a total terminal node numbers in a level "i". More preferably, the code length is calculated by subtracting "1" from the node position value which has a negative value firstly among the calculated node position values at the step c) becomes a coded codeword length. Also, wherein the total terminal node numbers $S_k$ of a prior level to a level in which a node corresponding to the detected codeword length is calculated by means of $$S_k = \sum_{i=0}^{k-1} L_i$$

at the step d), where, $S_k$ means the total terminal node numbers from level "0" to the prior level "k" and $L_i$ means a terminal node numbers in a level "i".

In order to accomplish the above second object of the present invention, there is provided an apparatus for decoding a variable length code, the apparatus comprising:

a packing part for receiving decoding bit string for decoding in which many variable length codewords are contained based on a Huffman code tree structure to pack the received coding bit string for decoding in the longest codeword length, and for shifting out a decoded codeword to pack a successive coding bit string except the decoded codeword in the coding bit string for decoding in the longest codeword length;

a boundary line sampling part for receiving the packed coding bit string for decoding of the longest codeword length from the packing part for sampling a boundary line of a codeword to calculate node position values for the received coding bit string for decoding of the longest codeword length in parallel and to output the calculated node position values, and for outputting the most significant bits of the calculated node position values;

at least one register for storing total terminal node numbers from a level "0" to a level before a corresponding level for a codeword decoding having the Huffman tree structure;

a code length detecting element for detecting a variable length codeword length for decoding from the decoding bit string from the boundary line sampling part according to the most significant bits of the calculated node position values by the boundary line sampling part, and for generating a first selection signal for selecting a node position value corresponding to the detected variable length codeword length and a second selection signal in order to select and enable a register from the at least one register to store total terminal node numbers from level "0" to a level before a level in which a node corresponding to the detected variable length codeword length is located;

a multiplexer for sequentially outputting the corresponding node position values from the boundary line sampling part selected according to the first selection signal from the code length detecting element;

a latch for latching a total terminal node number in the total terminal node numbers from the level "0" to a level before a corresponding level from the register and the corresponding node position values from the multiplexer;

an adder for adding the corresponding node position values to the total terminal node number, to output the added value; and a memory for storing decoding codewords from a root of the canonical code tree according to a node position of a coded codeword, and for outputting the corresponding decoding codeword the added value as an address from the adder.

Preferably, the packing part includes a barrel shifter for shifting out a decoded codeword from the received decoding bit string. Also, the code length detecting element includes a plurality of exclusive OR gates which logically exclusive OR combine the most significant bits of the node position values from the boundary line sampling part in order to enable one register from the at least one register. The latch includes a first latch for latching the total terminal node number in the total terminal node numbers from the register and a second latch for latching the corresponding node position values from the multiplexer. The memory is any one of a read only memory, a random access memory, and a programmable logic array. Also, the Huffman code tree includes terminal nodes having symbols and connect nodes not having symbols, has a canonical Huffman code tree having the terminal nodes thereof are positioned at the left of all connect nodes in a level. This Huffman code tree can be converted into a canonical Huffman code tree without increasing an average code length.

In a variable length code decoding method and apparatus according to the present invention, since a variable length coded codeword is stored in a look-up memory in a node order according to levels of a canonical Huffman code tree structure, and the node order of the coded codewords is detected by a predetermined calculating operation so that the node order is used as an address of the decoding codeword when decoding the variable length coded codeword. Therefore, the variable length code decoding is achieved in a manner which simply stores variables in a memory and a latch without changing a hardware when a Huffman code tree is changed by an operation of a central system. Also, since in the present invention a coded codeword may be processed with a clock using a parallel calculation regardless of a decoded codeword length, it can decode a coded codeword at higher speed than a conventional variable length decoding apparatus and method thereof which perform to decode in the unit of bit.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

A description will be given below in detail, with reference to the accompanying drawings, of the mechanical structure, the circuitry configuration, and the operation of a method and an apparatus for decoding a variable length code regarding an embodiment of the present invention.

Figure 4:
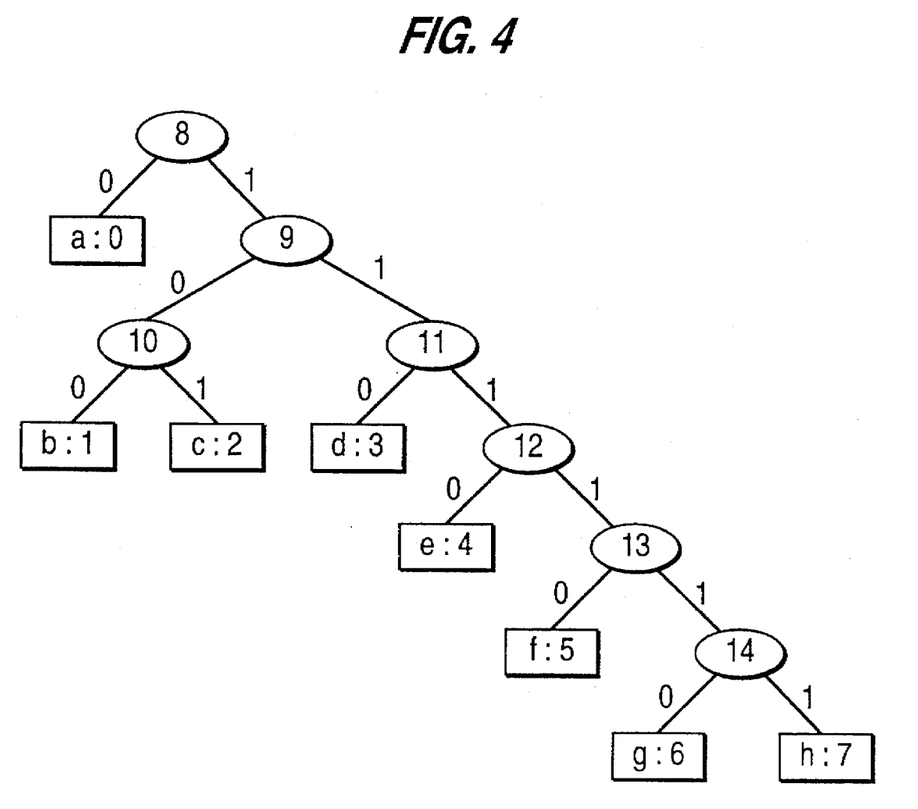
FIG. 4 is a schematic diagram for illustrating a structure of a canonical Huffman code tree which may be used in the present invention.

FIG. 4 schematically illustrates a structure of a canonical Huffman code tree. A Huffman code tree having n symbols is composed of (2n−1) nodes. That is, the (2n−1) nodes include n terminal nodes having symbols and (n−1) connect nodes having no symbols. A canonical Huffman code tree has a structure in which all terminal nodes are positioned to the left of all connecting nodes at one level. All Huffman code trees can be transformed into canonical Huffman code trees without increasing the an average code length. In FIG. 4, the structure of a canonical Huffman code tree for [a,b,c,d,e,f,g,h] is shown. Eight symbols are positioned to the left of all connecting nodes. Each symbol has a coding bit string as a codeword from a root to a terminal node thereof. For instance, a symbol 'c' has a three bit codeword '101' and a symbol 'f' has a five bit codeword '11110'. That is, each symbol has a variable codeword of a Huffman code tree according to an occurrence probability thereof. The meaning of [x:y] shown in FIG. 4 is as follows. An "x" indicates the symbol value of the corresponding codeword. A "y" represents the corresponding address of a memory in which the symbol is stored. A Table 1 shows the memory address for each symbol.

TABLE 1

Memory map of Huffman binary tree

| memory address | symbol data |
| --- | --- |
| 0 | a |
| 1 | b |
| 2 | c |
| 3 | d |
| 4 | e |
| 5 | f |
| 6 | g |
| 7 | h |

For example, [c:2] represents a symbol "c" including a three bit variable codeword "101" and the symbol "c" means that it is stored in an address "2" of the memory. The longest codeword length is six bits in FIG. 4 and corresponds to symbols "g" and "h".

Figure 5:
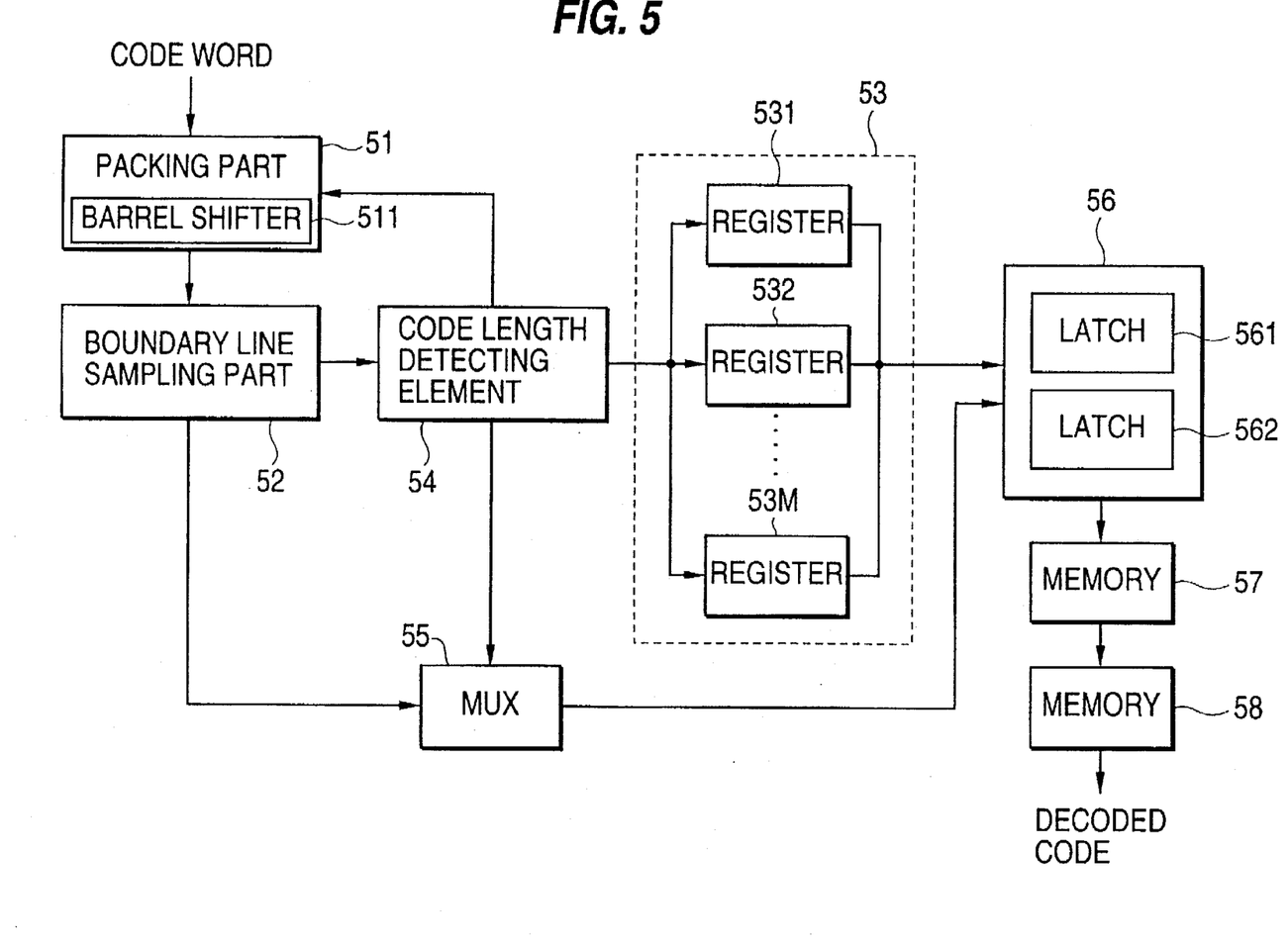
FIG. 5 is a block diagram for illustrating the configuration for a variable length code decoding apparatus according to one embodiment of the present invention.

FIG. 5 illustrates the configuration for a variable length code decoding apparatus according to one embodiment of the present invention. Referring to FIG. 5, the variable length code decoding apparatus according to one embodiment of the present invention comprises a packing part 51, a boundary line sampling part 52, a register 53, a code length detecting element 54, a multiplexer 55, a latch 56, an adder 57, and a memory 58. Packing part 51 receives a to-be-decoded coding bit string in which many variable length codewords are contained based on the Huffman code tree structure, packing part 51 packs the received to-be-decoded coding bit string in the longest codeword length, and shifts a decoded codeword out by means of a barrel shifter 511 therein to pack a successive coding bit string with the exception of the decoded codeword in the to-be-decoded coding bit string in the longest codeword length. Boundary line sampling part 52 receives the packed to-be-decoded coding bit string of the longest codeword length from packing part 51 for sampling a boundary line of a codeword and calculates $PT_k$ using an expression (1) which will be described later to output the calculated $PT_k$ into multiplexer 55, and outputs the MSBs of the calculated $PT_k$ into code length detecting element 54 in order to judge whether the calculated $PT_k$ is positive or negative. A method for calculating the $PT_k$ is as follows.

$$PT_k = \sum_{i=1}^{k} 2^{k-i}\gamma_i - \sum_{i=0}^{k-1} 2^{k-i}L_i \quad (1)$$

where, the $PT_k$ denotes node positions in accordance with binary input bits $\gamma_1, \gamma_2, \gamma_3 \ldots \gamma_k$ of from 1 to k in a level "k" of the Huffman tree (the top of each level is a node position "0", and the node position increases "1" each as the level descend downward therefrom), the $\gamma_1$ is a bit value of each bit string ($\gamma_1, \gamma_2, \gamma_3 \ldots$), and the $L_i$ is a total terminal node number in a level "i". That is, when the longest codeword length is 'M', boundary line sampling part 52 calculated all $PT_i$ of $1 \leq i \leq M$ in parallel. All $PT_k$ in a codeword have a positive value and the positive values means a node position. However, all $PT_i$ beyond a boundary line of a codeword have a negative value. Therefore, a value subtracting 1 from "i" of $PT_i$ which have a negative value first in all $PT_i$ becomes a coded codeword length. In register 53, $S_i$ including $S_1, S_2, S_3 \ldots S_M$, is stored in a first register 531, a second register 532, a third register 533 . . . a M-th register 53M, respectively. Register 53 outputs a $S_i$ stored in one register among the first register 531, the second register 532, the third register 533 . . . the M-th register 53M into a first latch 561 of latch 56 according to the level of an output signal from code length detecting element 54.

Code length detecting element 54 detects a variable length codeword length for decoding from the decoding bit string from boundary line sampling part 52 according to the MSBs of the calculated node position values $PT_k$ by boundary line sampling part 52, and for generating a first selection signal for selecting a node position value corresponding to the detected variable length codeword length and a second selection signal in order to select and enable the register from the at least one register 53 to store total terminal node numbers from level "0" to a prior level in which a node corresponding to the detected variable length codeword length is located. $S_k$ is a calculated value by means of an expression (2) which will be described later and means a total terminal node number from level "0" to a prior level to level "i".

$$S_k = \sum_{i=0}^{k-1} L_i \quad (2)$$

Figure 6:
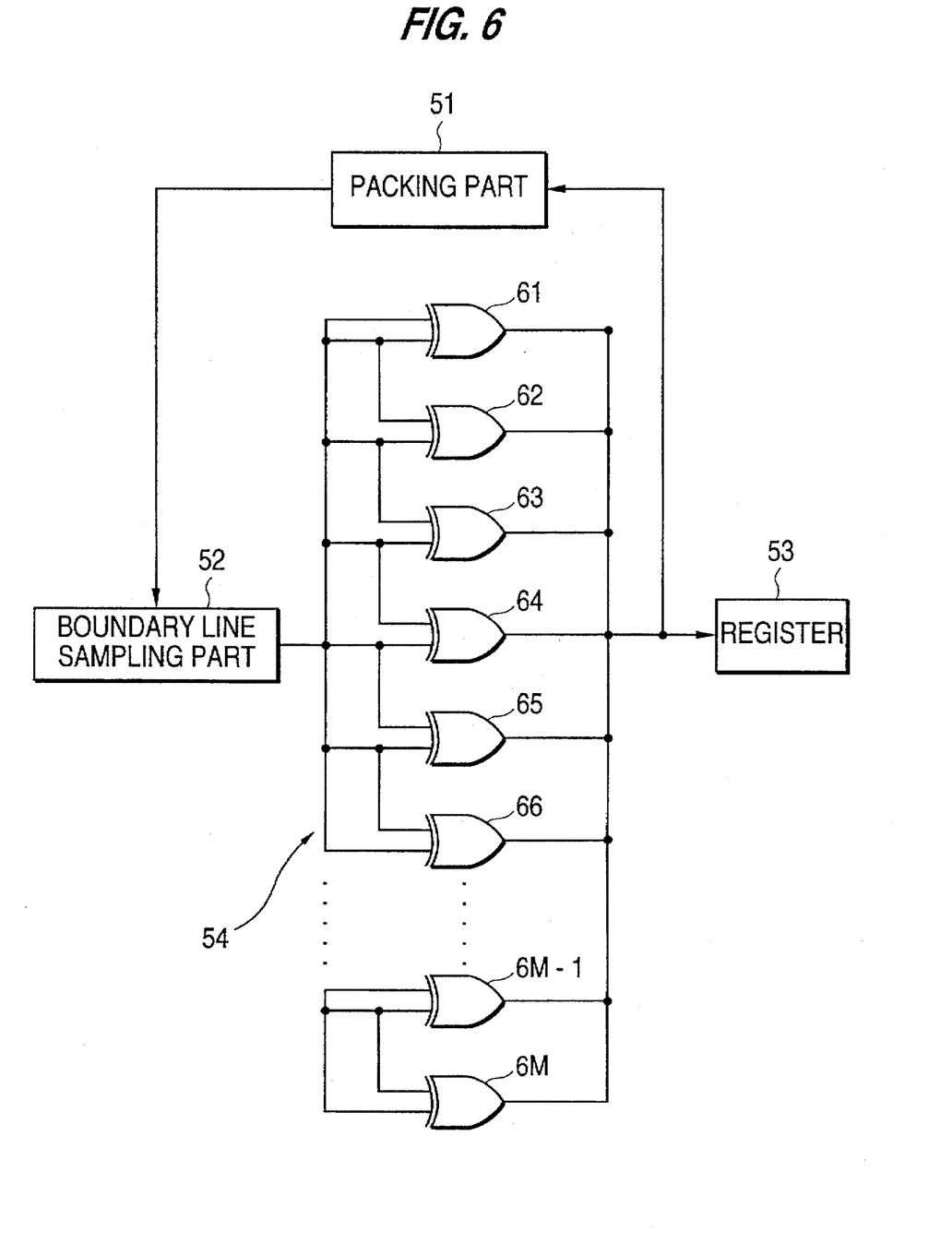
FIG. 6 is a circuitry diagram for showing an example of the code length detecting element as shown in FIG. 5.

FIG. 6 shows a circuitry diagram of the code length detecting element as shown in FIG. 5. Code length detecting element 54 includes a plurality of XOR gates 61, 62, 63 . .

. and 6M which logically-exclusive-OR combine MSBs of $PT_k$ provided from boundary line sampling part 52 in order to enable one register among register 53. Multiplexer 55 sequentially outputs node position values $PT_k$ from boundary line sampling part 52 selected in response to the first selection signal for outputting $S_k$ from code length detecting element 54 into a second latch 562 of latch 56. Latch 56 includes first and second latches 561 and 562. Latch 56 latches (stores temporarily) one $S_i$ from register 53 and one $PT_i$ from multiplexer 55. Adder 57 adds one $PT_i$ to one $S_i$, from latch 56 using an expression (3) which will be described later to output the added value $A_{ij}$ into memory 58.

$$A_{ij} = S_i + PT_i \quad (3)$$

where, $A_{ij}$ is a memory address which a codeword of a terminal node locates at "j" position of "i" level in a canonical Huffman code tree. In other words, adder 57 adds a second latch value in which a node position value $S_1$ corresponding to a codeword searched boundary line in a level of a node corresponding to a codeword searched boundary line is stored to a first latch value in which a total terminal node number of from level 0 to the prior level to a level in which anode corresponding to the codeword searched boundary line is stored. In memory 58, decoding codewords are stored from a root of the canonical code tree according to a node position of a coded codeword, outputs the corresponding decoding codeword using the $A_{ij}$ from adder 57 as an address, and has an ROM, and RAM or a programmable logic array (PLA).

Figure 7:
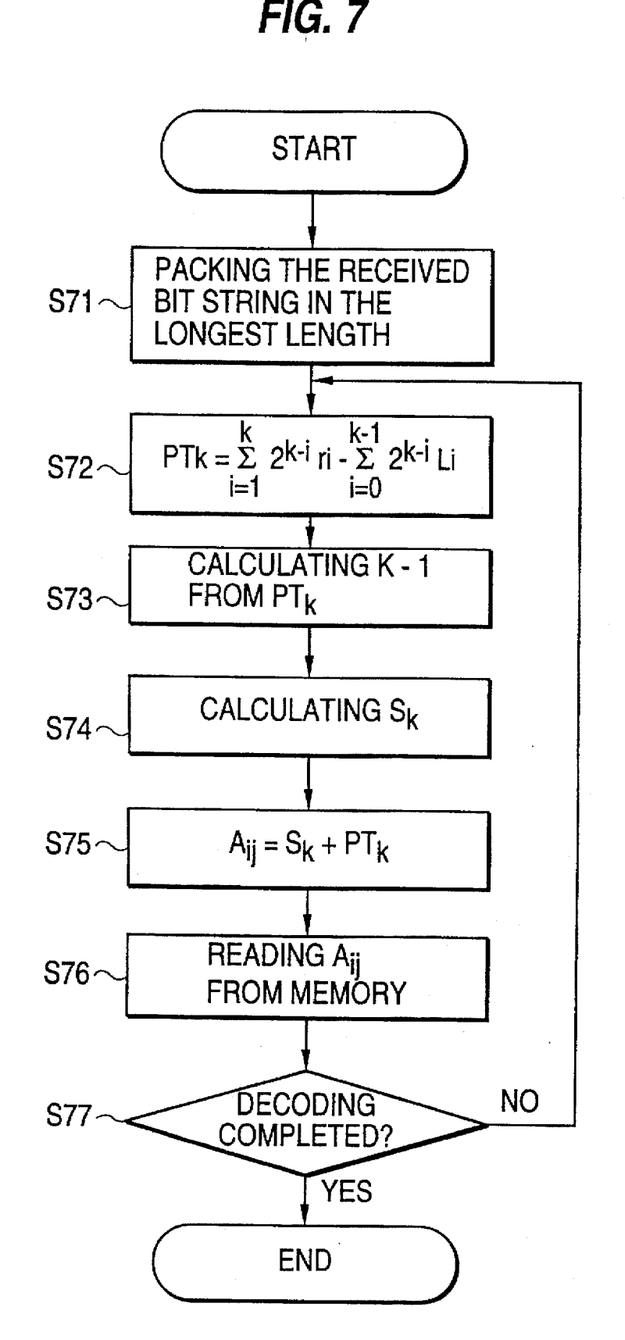
FIG. 7 is a flow chart for illustrating a variable length code decoding method according to one embodiment of the present invention.

Hereinafter, an operation of a variable length code decoding apparatus and a variable length code decoding method will be described by decoding for to-be-decoded codeword as binary coding bit string "101100001110 . . . ". the binary bit string "101100001110 . . . " represents a symbol string of "c b a a e . . . ". FIG. 7 is a flow chart for illustrating a variable length code decoding method according to one embodiment of the present invention.

The decoding method according to the present invention will be explained as follows. In look-up table memory, to-be-decoded codewords are sequentially stored from a root to the lowest level in response to a terminal node of a canonical code tree corresponding to a coded codeword. Packing part 51 calculates an address value of the memory 58 indicating a position in which the to-be-decoded codewords are stored.

At step S71, packing part 51 received a to-be-decoded coding bit string '101100001110 . . . ' to pack only the received bit string '101100' from the received to-be-decoded coding bit string as many as the longest codeword length (M) six and then outputs the packed bit string '101100' into boundary line sampling part 52. Then, at step S72, boundary line sampling part 52 receives the packed to-be-decoded coding bit string of the longest codeword length from packing part 51 for sampling a boundary line of a codeword and calculates node position values $PT_k$ using the expression (1) in parallel. In this embodiment, since the longest codeword length is six bits as shown in FIG. 4, boundary line sampling part 52 calculates all $PT_i$ of $1 \leq i \leq 6$ range using $\gamma_1\gamma_2\gamma_3\gamma_4\gamma_5\gamma_6$. $PT_1$ is calculated by substituting '1' into 'k' using the expression (1) as follows.

$$PT_1 = \sum_{i=1}^{1} 2^{1-i}\gamma_i - \sum_{i=0}^{0} 2^{1-i}L_i = 2^0 \cdot \gamma_1 - 2^1 \cdot L_0$$

In the meantime, since the $\gamma_1$ is a binary code '1' and the $L_0$ and $L_1$ which represent a terminal node number in each level are a decimal code '0' and '1', respectively, the $PT_1$ value can be obtained as follows.

$$PT_1 = 2^0 \cdot 1 - 2^1 \cdot 0 = 1$$

$PT_4$ is calculated as follows by substituting '4' into 'k' using the same manner because the $\gamma_1\gamma_2\gamma_3\gamma_4$ is a binary code '1011', and the $L_-$, $L_1$, $L_2$ and $L_3$ which represent terminal node numbers in each level have decimal codes '0', '1', '0' and '3', respectively.

$$\begin{aligned} PT_4 &= \sum_{i=1}^{4} 2^{4-i}\gamma_i - \sum_{i=0}^{4} 2^{4-i}L_i \\ &= (2^3 \cdot \gamma_1 + 2^2 \cdot \gamma_2 + 2^1 \cdot \gamma_3 + 2^0 \cdot \gamma_4) - \\ &\quad (2^4 \cdot L_0 + 2^3 \cdot L_1 - 2^2 \cdot L_2 + 2^1 \cdot L_3) \\ &= -3 \end{aligned}$$

When the decimal code '−3' is converted into a complement of two, the decimal code '−3' is represented as "1011101" by the six bits. Because the furthest left bit is a MSB is '1', it can be noted that $PT_4$ has a negative value. Each values of $PT_2$, $PT_3$, $PT_5$ and $PT_4$ can be calculated in the same manner as above. The result is shown in the following Table 2.

TABLE 2

| $PT_k$ | $PT_k$ decimal | binary(MSB → LSB) | sign |
|---|---|---|---|
| $PT_1$ | 1 | 000001 | positive |
| $PT_2$ | 0 | 000000 | positive |
| $PT_3$ | 1 | 000001 | positive |
| $PT_4$ | −3 | 111101 | negative |
| $PT_5$ | −8 | 111000 | negative |
| $PT_6$ | −18 | 101110 | negative |

At this time, boundary line sampling part 52 outputs the calculated $PT_1$, $PT_2$, $PT_3$, $PT_4$, $PT_5$ and $PT_6$ into multiplexer 55 to use the addresses of an decoding codeword. Also, boundary line sampling part 52 outputs MSBs 0, 0, 0, 1, 1 and 1 of the calculated values of $PT_1$, $PT_2$, $PT_3$, $PT_4$, $PT_5$ and $PT_6$ into code length detecting element 54 in order to judge whether the calculated values of $PT_1$, $PT_2$, $PT_3$, $PT_4$, $PT_5$ and $PT_6$ are positive or negative. That is, in the present invention, since the node numbers have been stored in first, second, third, fourth, fifth, sixth, . . . Mth registers 531, 532, 533, 534, 535, 536 . . . 53M of register 53, code length detecting element 54 receives MSBs 0, 0, 0, 1, 1 and 1 of the calculates values of $PT_1$, $PT_2$, $PT_3$, $PT_4$, $PT_5$ and $PT_6$ from boundary line sampling part 52 to control the corresponding register. That is, code length detecting element 54 receives a first bit '0' of the MSBs 0, 0, 0, 1, 1 and 1 through a first input terminal of a first XOR 61, a second bit '0' thereof through a second terminal of first XOR 61 and a first terminal of a second XOR 62, a third bit '0' thereof through a second terminal of second XOR 62 and a first terminal of a third XOR 63, a fourth bit '1' thereof through a second terminal of third XOR 63 and a first terminal of a fourth XOR 64, a fifth bit '1' thereof through a second terminal of fourth XOR 64 and a first terminal of a fifth XOR 65, a sixth bit '1' thereof through a second terminal of fifth XOR 65 and a first terminal of a sixth XOR 66, and a sixth bit '1' thereof through a first terminal of sixth XOR 66 and '1' through a second terminal of sixth XOR 66 to enable only the third XOR 63 as '1'. Accordingly, a $S_3$ "1" is outputted into first latch 561 from third XOR 63 which has been enabled as above.

As shown in Table 2, $PT_1$, $PT_2$ and $PT_3$ have positive signs because the MSBS thereof is "0". The decimal codes '1', '0', and '1' of the $PT_1$, $PT_2$, and $PT_3$ indicate node positions in the corresponding level, respectively. $PT_4$, $PT_5$ and $PT_6$ have negative signs because the MSBs thereof is "1". Therefore, code length detecting element 54 can calculate a level of the tree structure in which a final bit of the current decoding codeword is located by searching a position generating '1', that is, a negative value firstly in $PT_k$ from boundary line sampling part 52. That is, a first codeword length is calculated from the inputted bit string. In an embodiment according to the present invention, the codeword length "3" (that is, "101" from "101100001110 . . . ") located in a third level indicating a decoding codeword length first is achieved by subtracting "2" from "i" (i−1=4−1), that is, "4" generating a negative value first at step S73. Then, a total node number $S_3$ in a level from level "0" to a prior level in which a node in a tree structure corresponding to the decoding codeword "101" of the codeword length "3" is located and calculated by means of the expression (2) at step S74.

$$S_3 = \sum_{i=0}^{3-1} L_i = L_0 + L_1 + L_2 = 0 + 1 + 0 = 1$$

Then, code length detecting element 54 generates a second selection signal for selecting the calculated $PT_3$, that is, a node position in a level in which a node of the tree structure of the detected codeword for decoding, from boundary line sampling part 52 based on the calculated codeword length '3' to output the generated second selection signal into multiplexer 55. Then, multiplexer 55 selects the $PT_3$ value to output second latch 562.

Then, at the step S75, adder 57 adds $PT_3$ from a second latch 562 to $S_3$ from a first latch 561 to output the added value $A_{33}$ into memory 58. The added value $A_{33}$ is an address of memory 58 in which a decoding codeword corresponding to a coding codeword searching a boundary line of a code is stored. Therefore, at the step S76, memory 58 receives the address $A_{33}=2$ from adder 57 to output a decoding codeword "c" corresponding to the address "2" so that a codeword is decoded. Then, packing part 51 receives a code length "3" of the decoded codeword "101" from code length sampling part 52 which packs an inputted bit (100001110 . . . ) from a successive bit except the decoded bit string "101" as many as the longest codeword length (M) six ('100001'), to output the packed bit string '100001' into boundary line sampling part 52, and the packed bit string '100001' is decoded in the same manner so that all inputted bit strings 100001110 . . . can be decoded.

Then at the step S77, packing part 51 judges whether or not to-be-decoded bit strings still remain. As the result of the judgment at the step S77, if no to-be-decoded bit strings remain and the decoding is completed, packing part 51 completes the decoding. However, when to-be-decoded bit strings remain, packing part 51 returns to the step 71 and repeats the operation after the step S71 in the same manner.

In other words, a first, a decoding codeword length is calculated, a memory address in which the codeword is stored is calculated by the expression (3). That is, the memory address is obtained by adding $PT_i$ of the corresponding codeword in the Huffman code tree to $S_i$ thereof. In this embodiment, the code length is three bits. Therefore, the memory address can be obtained from $PT_3+S_3$. Since the $PT_3$ is "1" as shown in a table 2 and the $S_3$ is "1" as a total terminal none number from a root to a level "2" the memory address becomes "2". Therefore, at a final the step, the system obtains a final decoding symbol by reading the data corresponding to the memory address "2". That is, the user can know a decoding symbol in which is stored the memory address "2" is "c". In other words, it is obtained by the calculating operation that significant three bits $\gamma_1\gamma_2\gamma_3$ (="101") among a coding bit string corresponds to a codeword of a symbol "c". The remaining coding bit string can be decoded by shifting it as many as the code length of the decoded codeword and using the same way as above. That is, because the $\gamma_1\gamma_2\gamma_3$ is decoded, a barrel shifter shifts out the decoded $\gamma_1\gamma_2\gamma_3$ from the decoding bit string and receives successive value $\gamma_3\gamma_4\gamma_5\gamma_6\gamma_7\gamma_8\gamma_9\gamma_{10}\gamma_{11}\cdots$ ("100001110 . . . ") to decode the received successive value $\gamma_3\gamma_4\gamma_5\gamma_6\gamma_7\gamma_8\gamma_9\gamma_{10}\gamma_{11}$ . . . for in the same way. Accordingly, information symbol string of " c b a a e . . . " corresponding to a bit string 101100001110 . . . is obtained.

As described above, in accordance with the present invention, since a variable length coded codeword is stored in a look-up memory in a node order according to levels of a canonical Huffman code tree structure, and the node order of the coded codewords is detected by a predetermined calculating operation so that the node order is used as an address of the decoding codeword when decoding the variable length coded codeword. Therefore, the variable length code decoding is achieved in a manner which simply stores variables in a memory and a latch without changing a hardware when a Huffman code tree is changed by an operation of a central system. Also, since the present invention may by processing a coded codeword with a clock using a parallel calculation regardless of a decoded codeword length, it can decode a coded codeword at higher speed than a conventional variable length decoding apparatus and method thereof which perform to decode in the unit of bit. Therefore, the present invention may be used for a reverse compression image being capable of compensating a motion such as an MPEG1, and MPEG2 and an H.261; a multiple compression of a static image such as a JPEG; and all the application which can do entropy coding.

The invention may be embodied in other specific forms without departing from the spirit or essential characteristics thereof. The present embodiments are therefore to be considered in all respects as illustrative and not respective, the scope of the invention being indicated by the appended claims rather than by the foregoing description and all changes which come within the meaning and range of equivalency of the claims are therefore intended to be embraced therein.

What is claimed is:

1. A method for decoding a variable length code, said method comprising the steps of:
   a) receiving a coding bit string for decoding having a plurality of variable length codewords based on a Huffman code tree structure, for packing the received coding bit string for decoding to obtain a longest codeword length, and for outputting the packed coding bit string for decoding;
   b) calculating node position values for the packed coding bit string for decoding the longest codeword length outputted from the step a) in order to detect a boundary line of a codeword from the packed coding bit string for decoding the longest codeword length;
   c) detecting a code length of the variable length codeword according to the calculated node position values from the step b);
   d) calculating a total terminal node number from level "0" prior level to a in which a node corresponding to a codeword according to the detected code length from the step c) is located;
   e) adding the node position value corresponding to the detected code length from the the step c) in the calculated node position values from the step b) to the calculated total terminal node number from the step d), to output the added value;

f) reading out to-be decoded codewords having the added value from the step e) as an address from a memory which are sequentially storing the decoding codewords from a root of a canonical Huffman code tree according to by node position of decoded codeword; and g) judging whether or not a bit string to be decoded remains, if no finish a routine, and if yes return to the step a).

2. The method for decoding a variable length code as claimed in claim 1, wherein the node position values are calculated by an expression $$PT_k = \sum_{i=1}^{k} 2^{k-1} \gamma_i - \sum_{i=0}^{k-1} 2^{k-1} L_i$$

at the step b), wherein the $PT_k$ denotes node positions in accordance with binary input bits $\gamma_1, \gamma_2, \gamma_3 \ldots \gamma_k$ from '1' to 'k' in a level "k" of the Huffman tree, the $\gamma_1$ is a bit value of each bit string $\gamma_1, \gamma_2, \gamma_3 \ldots$, and the $L_i$ is the total terminal node numbers in a level "i".

3. The method for decoding a variable length code as claimed in claim 1, wherein the code length is calculated by subtracting "1" from the node position value which has a negative value firstly among the calculated node position values at the step c) becomes a coded codeword length.

4. The method for decoding a variable length code as claimed in claim 1, wherein the total terminal node numbers $S_k$ of the prior level to a level in which a node corresponding to the detected codeword length is calculated by means of $$S_k = \sum_{i=0}^{k-1} L_i$$

at the step d), where, $S_k$ means the total terminal node numbers from level "0" to the prior to level "k" and $L_i$ means a terminal node numbers in a level "i".

5. An apparatus for decoding a variable length code, said apparatus comprising:

a packing part for receiving encoding bit string for decoding in which many variable length codewords are contained based on a Huffman code tree structure to pack the received coding bit string for decoding the longest codeword length, and for shifting out a decoded codeword to pack a successive coding bit string except decoded codeword in the coding bit string for decoding the longest codeword length;

a boundary line sampling part for receiving the packed coding bit string for decoding the longest codeword length from said packing part of sampling a boundary line of a codeword to calculated node position values for the received coding bit string for decoding the longest codeword length in parallel and to output the calculated node position values, and for outputting the most significant bits of the calculated node position values;

at least one register for storing total terminal node numbers from a level "0" to a level before a corresponding level for a codeword decoding having the Huffman tree structure;

a code length detecting element for detecting a variable length codeword length for decoding from the decoding bit string from said boundary line sampling part according to the most significant bits of the calculated node position values by said boundary line sampling part, and for generating a first selection signal for selecting a node position value corresponding to the detected variable length codeword length and a second selection signal in order to select and enable a register from the at least one register to store total terminal node numbers from level "0" to a level before a level in which a node corresponding to the detected variable length codeword length is located;

a multiplexer for sequentially outputting corresponding node position values from said boundary line sampling part selected according to the first selection signal from said code length detecting element;

a latch for latching a total terminal node number in the total terminal node numbers from the level "0" to a level before a corresponding level from said register and the corresponding node position values from said multiplexer;

an adder for adding the corresponding node position values to the total terminal node number, to output the added value; and a memory for storing decoding codewords from a root of the canonical code tree according to a node position of a coded codeword, and for outputting the corresponding decoding codeword the added value as an address from said adder.

6. The apparatus for decoding the variable length code as claimed in claim 5, wherein said packing part includes a barrel shifter for shifting out a decoded codeword from the received decoding bit string.

7. The apparatus for decoding the variable length code as claimed in claim 5, wherein said code length detecting element includes a plurality of exclusive OR gates which logically exclusive OR combine the most significant bits of the node position values from said boundary line sampling part in order to enable one register from said at least one register.

8. The apparatus for decoding a variable length code as claimed in claim 5, wherein said latch includes the first latch for latching the total terminal node number in the total terminal node numbers from said register and a second latch for latching the corresponding node position values from said multiplexer.

9. The apparatus for decoding the variable length code as claimed in claim 5, wherein said memory is any one of a read only memory, a random access memory, and a programmable logic array.

10. The apparatus for decoding the variable length code as claimed in claim 5, wherein the Huffman code tree includes terminal nodes having symbols and connect nodes not having symbols, has a canonical Huffman code tree having the terminal nodes thereof are positioned at the left of all connect nodes in the level.

11. The apparatus for decoding the variable length code as claimed in claim 5, wherein the Huffman code tree can be converted into a canonical Huffman code tree without increasing an average code length.

\* \* \* \* \*